US 6,663,400 B1

(12) United States Patent
Yokoyama

(10) Patent No.: US 6,663,400 B1
(45) Date of Patent: Dec. 16, 2003

(54) WIRING BOARD HAVING CONNECTOR AND METHOD OF MANUFACTURING THE SAME

(75) Inventor: Eizi Yokoyama, Kyoto (JP)

(73) Assignee: Rohn Co., Ltd., Kyoto (JP)

( * ) Notice: Subject to any disclaimer, the term of this patent is extended or adjusted under 35 U.S.C. 154(b) by 0 days.

(21) Appl. No.: 10/089,512

(22) PCT Filed: Sep. 28, 2000

(86) PCT No.: PCT/JP00/06735

§ 371 (c)(1),
(2), (4) Date: Mar. 29, 2002

(87) PCT Pub. No.: WO01/26434

PCT Pub. Date: Apr. 12, 2001

(30) Foreign Application Priority Data

Oct. 1, 1999 (JP) .......................................... 11-281499

(51) Int. Cl.[7] .............................................. H01R 12/00
(52) U.S. Cl. ........................................ 439/67; 174/88 R
(58) Field of Search ..................... 439/67, 77; 174/88 R

(56) References Cited

U.S. PATENT DOCUMENTS 4,838,804 A    6/1989  Banjo et al.

FOREIGN PATENT DOCUMENTS

| JP | 57-17192 | 1/1982 |
| JP | 2-14680 U | 1/1990 |
| JP | 4-191993 | 7/1992 |
| JP | 8-236895 | 9/1996 |

*Primary Examiner*—Khiem Nguyen
(74) *Attorney, Agent, or Firm*—Morgan, Lewis & Bockius LLP

(57) ABSTRACT

This invention intends to improve the productivity and quality and reduce the production cost by adopting the same structure for the connector as that of the wiring board. A connector-equipped wiring board (A), wherein a connector (30) connected to a wiring board (10) with an electronic component (C) mounted thereon through a flexible wiring plate (20) can be routed to the wiring board (10), characterized in that said connector (30) is formed of the same board as the wiring board (10) is formed, and has an exposed terminal pattern (31) formed on its surface and electrically connected to said flexible wiring plate (20).

8 Claims, 6 Drawing Sheets

WIRING BOARD HAVING CONNECTOR AND METHOD OF MANUFACTURING THE SAME

TECHNICAL FIELD

This invention relates to a wiring board equipped with a connector (hereinafter referred to connector-equipped wiring board) to be built in a case such as a battery pack and a method for manufacturing the same.

BACKGROUND ART

For example, a notebook computer or portable telephone is equipped with a battery pack for use in a battery such as lithium ion battery or manganese battery so as to be removable from a body. A connector-equipped wiring board which is connectable to a socket on the body side is built in the case such as a battery pack.

FIG. 9 is a perspective view of an exemplary ordinary connector-equipped wiring board. As seen from FIG. 9, a connector-equipped wiring board X includes a wiring board with an electronic components C mounted thereon and a connector 300 formed in a shape of a male housing, which is connected to the wiring board 300 by wires 200. The one ends 200a of the wires 200 are bonded to wiring patterns 110 on the wiring board 100 by soldering. The other ends 200b of the wires 200 are electrically connected to terminals (not shown) within the housing of the connector 300. The connector 300 is adapted to be freely extendable by the wires 200 which can be freely deformed within the case (not shown) of the battery pack and its tip partially protrudes outside from the case so that it is mated with the female socket (not shown) on the side of the body not shown.

In the manufacture of such a connector-equipped wiring board X, the connector 300 is previously connected to the wires 200 to prepare an integral component. On the other hand, on the wiring board 100, electronic components C are previously mounted. Thereafter, the one ends 200a of the wires 200 are soldered to the wiring patterns 110 on the wiring board 100, respectively. Thus, the connector-equipped wiring board X as shown in FIG. 9 is completed.

Meanwhile, in a mounting step of mounting the electronic components C on the wiring board 100, automation has been in progress from before by using e.g. an automated mounting device. On the other hand, in a connecting step of connecting the wires 200 to the wiring board 100, since the integral component composed of the connector 300 and wires 200 is manufactured in a separated manufacturing line and is difficult to handle, the wires 200 are manually soldered to the wiring board 100. In such a manufacturing method, equipment for making the respective components such as the wiring board and the connector is required. In addition, a consistent manufacturing system by factory automation cannot be structured. Therefore, this method is inferior in productivity, and could not improve the quality and reduce the production cost.

In view of the circumstance described above, an object of this invention is to provide a connector-equipped wiring board and a method for manufacturing the same which can easily improve the productivity and quality and reduce the production cost by adopting the same structure for the connector as that of the wiring board.

DISCLOSURE OF THE INVENTION

In order to solve the above problem, this invention takes the following technical means.

The connector-equipped wiring board according to the first aspect of this invention is a connector-equipped wiring board, wherein a connector connected to a wiring board with an electronic component mounted thereon through a conductive member can be freely routed to the wiring board, characterized in that said connector is made of a board having an exposed terminal pattern formed on its surface and electrically connected to said conductive member.

Namely, the above connector-equipped wiring board is characterized in that the terminal pattern constitutes a card edge type male connector, and constitutes a connector-equipped wiring board which can be manufactured to provide great reliability.

As a method for manufacturing the connector-equipped wiring board according to the first aspect, the method for manufacturing a connector-equipped wiring board according to the second aspect of this invention is a method of manufacturing a connector-equipped wiring board, wherein a connector connected to a wiring board with an electronic component mounted thereon through a conductive member can be freely routed to the wiring board, comprising the steps of:

a board member making step of making a board member having a wiring pattern corresponding to said wiring board and another board member with a terminal pattern exposed on the surface so as to correspond to said connector, and arranging these boards as a pair;

mounting step of mounting an electronic component on the surface of the board member so as to communicate with the wiring pattern of the board member corresponding to said wiring board; and connecting step of connecting said wiring pattern and said terminal pattern to each other though said conductive member.

In accordance with the connector-equipped wiring board according to the first aspect and the method for manufacturing a connector-equipped wiring board according to the second aspect, the connector can be formed of the same board as the wiring board is formed. Specifically, the connector can be manufactured by the same manufacturing process as the wiring board as a "card edge type male connector" with an terminal pattern exposed on the surface so that the board itself can be inserted into a socket. Therefore, it is not necessary to provide the individual manufacturing equipment for each of the wiring board and connector. This easily leads to improvement of the productivity and quality of the product and cost reduction through a consistent production system by factory automation.

In a preferred embodiment of the connector-equipped wiring board according to the first aspect, said conductive member is formed of a flexible wiring plate.

In a preferred embodiment of the method for manufacturing a connector-equipped wiring board according to the second aspect, a flexible wiring plate is used as said conductive member.

In accordance with the embodiments described above, the flexible wiring plate can be brought nearer to the surfaces of the wiring board and the connector which are planar so that these wiring board and connector can be connected to each other through the flexible wiring plate. For this reason, the flexible wiring plate thus connected can be bent so that the connector is situated freely relatively to the wiring board. In addition, in connecting the flexible wiring plate, it can be easily handled as a flexible wiring plate as compared with a fine wire. The flexible wiring plate can be arranged to cover the electronic component on the wiring board in such a fashion that the one end of the flexible wiring plate is connected to the vicinity of the one end of the wiring board and the other end thereof is connected to the board serving as the connector arranged on the other end of the wiring board. In such a configuration, the wiring board with improved protection and great reliability can be acquired.

In another preferred embodiment of the first aspect, the board of said connector has a depression for stopping away from the terminal pattern.

In such a configuration, for example, where the wiring board is housed in a case and the connector is arranged outside the case while extending out the conductive member from a slot made in the case, the connector can be fixedly inserted into a socket outside the case through the depression, and can surely make an electric connection to the outside through the connector.

In another preferred embodiment of the second aspect, said board member making step includes a step of integrally forming the board members corresponding to said wiring board and said connector from a common frame board, and the board members corresponding to said wiring board and said connector are separated from said frame board after said connecting step.

In such a configuration, the respective board members corresponding to the wiring board and connector are made integrally to the frame board. A pair or plural pairs of board members required for the wiring board(s) and the connector (s) can be simultaneously made from such a frame board. Thus, the wiring boards belonging to different kinds and connectors can be made from the frame board which is a single raw board. This further improves the productivity of the connector-equipped wiring board.

In another embodiment of the second aspect, said connecting step includes a step of bonding conductive portions extended out from both ends of said conductive member to said wiring pattern and said terminal pattern by soldering.

In such a configuration, the conductive member can be simultaneously connected to both the wiring board and connector by soldering. Therefore, the conductive member can be coupled with these wiring board and connector at a time. This further improves the productivity of the connector-equipped wiring board.

The other features and advantages of this invention will be more apparent from the following description of various embodiments.

Figure 1:
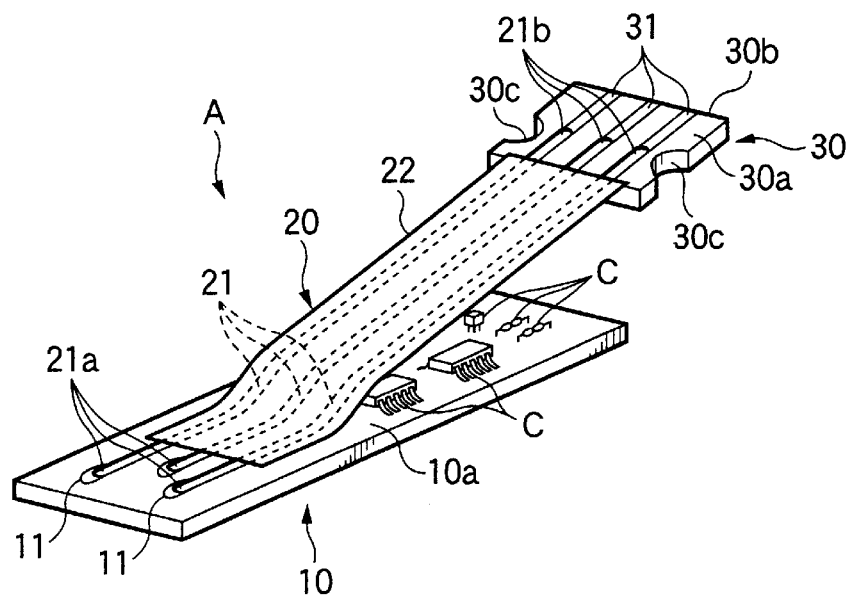
FIG. 1 is a perspective view of an embodiment of a connector-equipped wiring board according to this invention.

Incidentally, reference symbol A denotes a connector-equipped wiring board; C individual electronic components; 10 a wiring board; 11 individual wiring patterns; 20 a flexible wiring plate (conductive member); 21 individual conductive patterns; 30 a connector; 30c individual depressions; 31 individual terminal patterns; 40 a frame board; 10A a board member corresponding to the wiring board; and 30A a board member corresponding to the connector.

BEST MODE FOR CARRYING OUT THE INVENTION

Now referring to the drawings, an explanation will be given of preferred embodiments of this invention.

Figure 2:
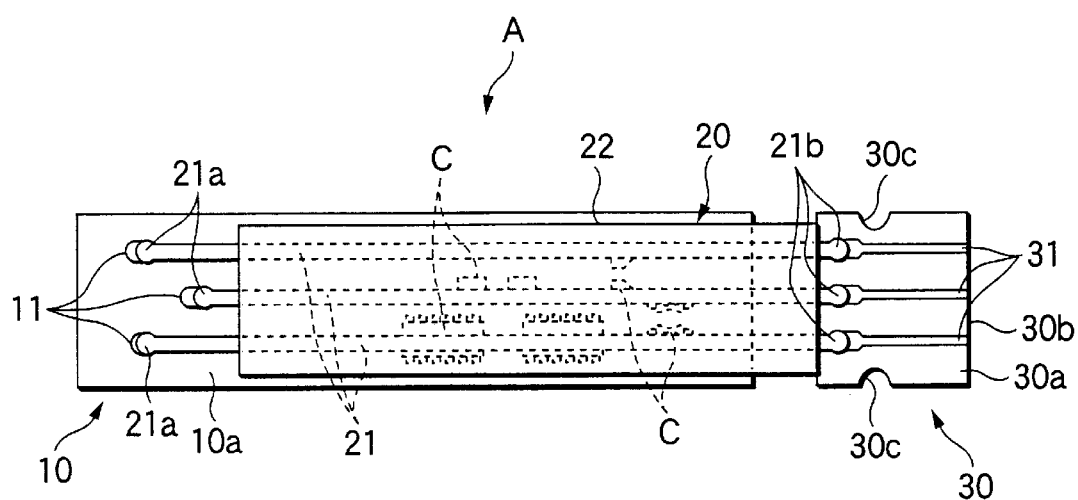
FIG. 2 is a plan view of the connector-equipped wiring board shown in FIG. 1.
Figure 3:
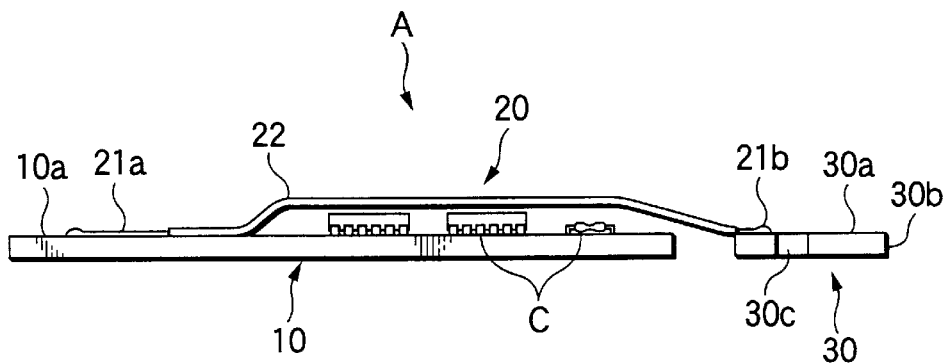
FIG. 3 is a side view of the connector-equipped wiring board shown in FIG. 1.
Figure 4:
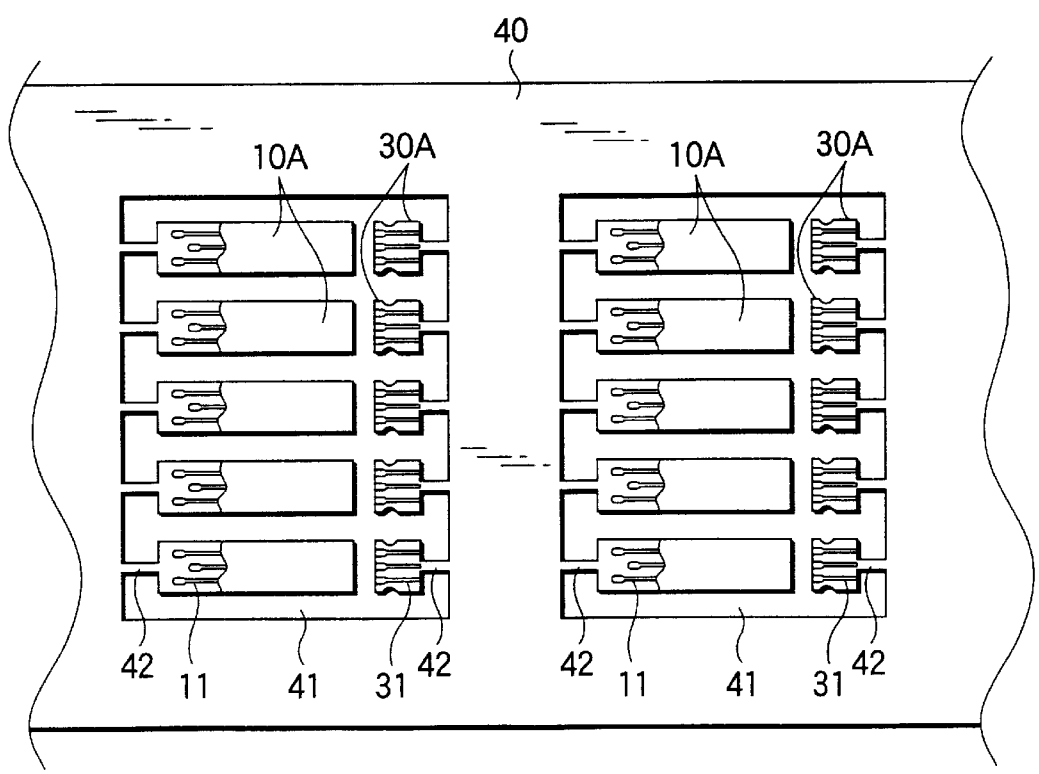
FIG. 4 is a perspective view for explaining a manufacturing step in a method of manufacturing the connector-equipped wiring board shown in FIGS. 1 to 3.

FIG. 1 is a perspective view of an embodiment of a connector-equipped wiring board according to this invention. FIG. 2 is a plan view of the connector-equipped wiring board shown in FIG. 1. FIG. 3 is a side view of the connector-equipped wiring board shown in FIG. 1.

As seen from these figures, the connector-equipped wiring board A includes the wiring board 10 with the electronic components C mounted thereon and the connector 30 formed in a board shape, which are connected to each other by the flexible wiring plate 20 which serves as a conductive member.

The wiring board 10 is mainly made of a rigid substance of e.g. glass epoxy resin. On the surface 10a thereof, the wiring patterns 11 of e.g. copper foil are formed. The electronic components such as a semiconductor chip and a resistor are connected to predetermined positions of the wiring patterns 11 by e.g. soldering. The terminals of the wiring patterns 11 are provided as portions to be connected to the flexible wiring plate 20 (described below) on the surface 10a of the wiring board 10. It should be noted that only the vicinity of the terminals of the wiring patterns 11 are illustrated (not shown in FIG. 3), but the entire shape thereof is not illustrated.

The flexible wiring plate 20 is a thin base film 22 of polyimide resin covering conductive patterns 21 of e.g. copper foil, and can be easily bent for deformation. As seen from FIG. 2, the flexible wiring plate 20 has a length enough to reach the connector 30 arranged beside the wiring board 10 in a state extended straight from the terminals of the wiring patterns 11. At the tips of in the longitudinal direction of the flexible wiring plate 20, the tips 21a and 21b of the conductive patterns 21 are extended out from the base film 22 so that they are electrically connected to the terminals of the wiring patterns 11 and the terminal patterns 31 of the connector 30 described later. The one tips 21a of the conductive patterns 21 are soldered to the terminals of the wiring patterns 11 on the wiring board 10, whereas the other tips 21b of the conductive patterns 21 are soldered to the terminal patterns 31 on the connector 30.

Like the wiring board 10, the connector 30 is mainly made of a rigid substance of e.g. glass epoxy resin. On the surface 30a thereof, the terminal patterns 31 of e.g. copper foil are formed (not illustrated in FIG. 3) so as to be exposed. The terminal patterns 31 have pitches corresponding to the conductive patterns 21 of the flexible wiring plate 20. Further, the terminal patterns 31 are extended straight from the connecting portion to the conductive patterns 21 of the flexible wiring plate 20 to the tip 30b of the connector 30. The connector 30 has, on its both sides, depressions 30c which are recessed in the thickness direction away from the terminal patterns 31. The depressions 30c are used to fixedly insert the connector 30 into a socket described later. Incidentally, the connector 30 may be a card-edge type male connector. The details of a method of using it will be described later.

Now referring to the drawings, an explanation will be given of a method of manufacturing the connector-equipped wiring board A having the structure described above.

FIGS. 4 to 7 are views shown in step order of the method for manufacturing the connector-equipped wiring board A in FIGS. 1 to 3. First, in a step of making boards, board members 10A and 30A corresponding to the wiring boards 10 and connectors 30 are formed integrally in a common frame board 40. The frame board 40 is a raw board of rigid substance which corresponds to the wiring boards 10 and the connectors 30. Spaces 40 are formed in the frame board 40. In the spaces 41, a plurality of pairs of the boards 10A and 30A being adjacent to each other are formed lengthwise at regular intervals. Namely, the respective board members 10A and 30A are formed so that the spaces 41 of the frame board 40 are made in a prescribed shape. The respective board members 10A, 30A are integrated to the frame board 40 so that they are connected to each other via thin communicating portions 42. In such a frame board 40, on the surface of each of the board members 10A and 30A, a conductive film is formed by vacuum evaporation. Thereafter, the wiring patterns 11 and terminal patterns 31 are formed by photolithography.

Figure 5:
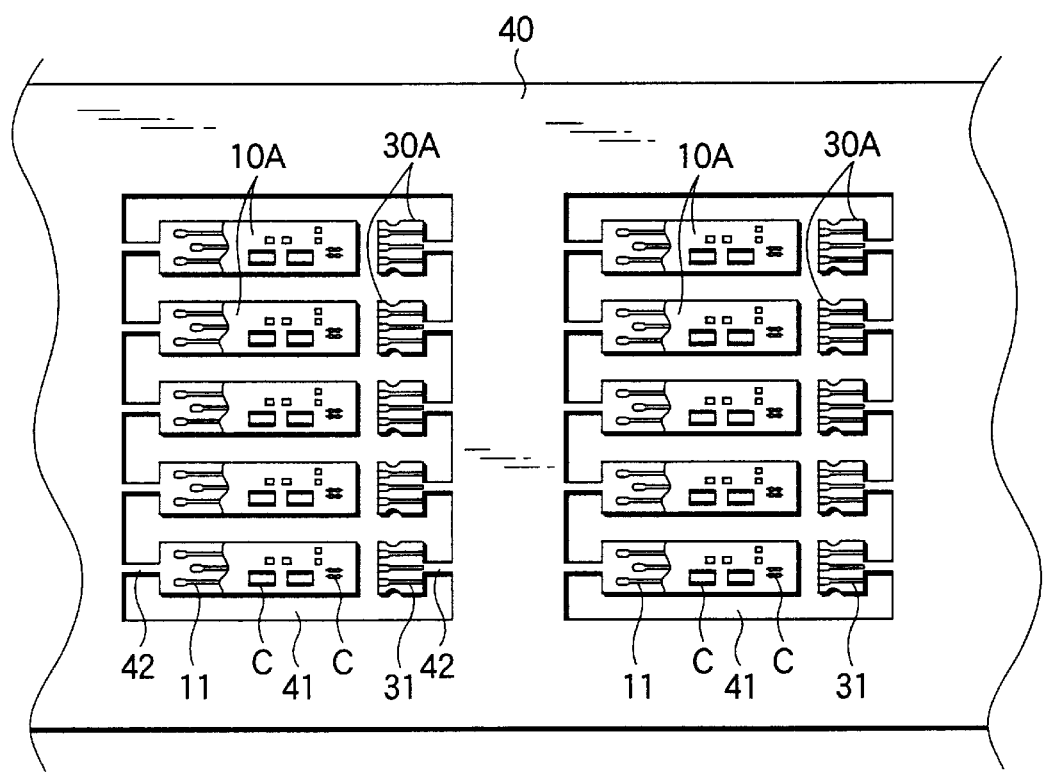
FIG. 5 is a perspective view for explaining a manufacturing step in a method of manufacturing the connector-equipped wiring board shown in FIGS. 1 to 3.

Next, as seen from FIG. 5, in a mounting step, the electronic components C are mounted on the wiring patterns 11 of the board member 10A corresponding to the wiring board 10. In this case, creamy solder (not shown) is first applied to the terminals of the wiring patterns 11 of the board member 10A and the terminals of the terminal patterns 31 of the board member 30A corresponding to the connector 30. Thereafter, the electronic components C are handled by an automated mounting device so that the electronic components C required for the wiring board 10 are mounted on the terminals of the wiring patterns 11 with the aid of the creamy solder. It should be noted that the creamy solder is in a paste state and not still hardened, immediately after the electronic components have been mounted, first hardened in a step of connecting the flexible wiring plate 20 which is to be executed after the mounting step.

Figure 6:
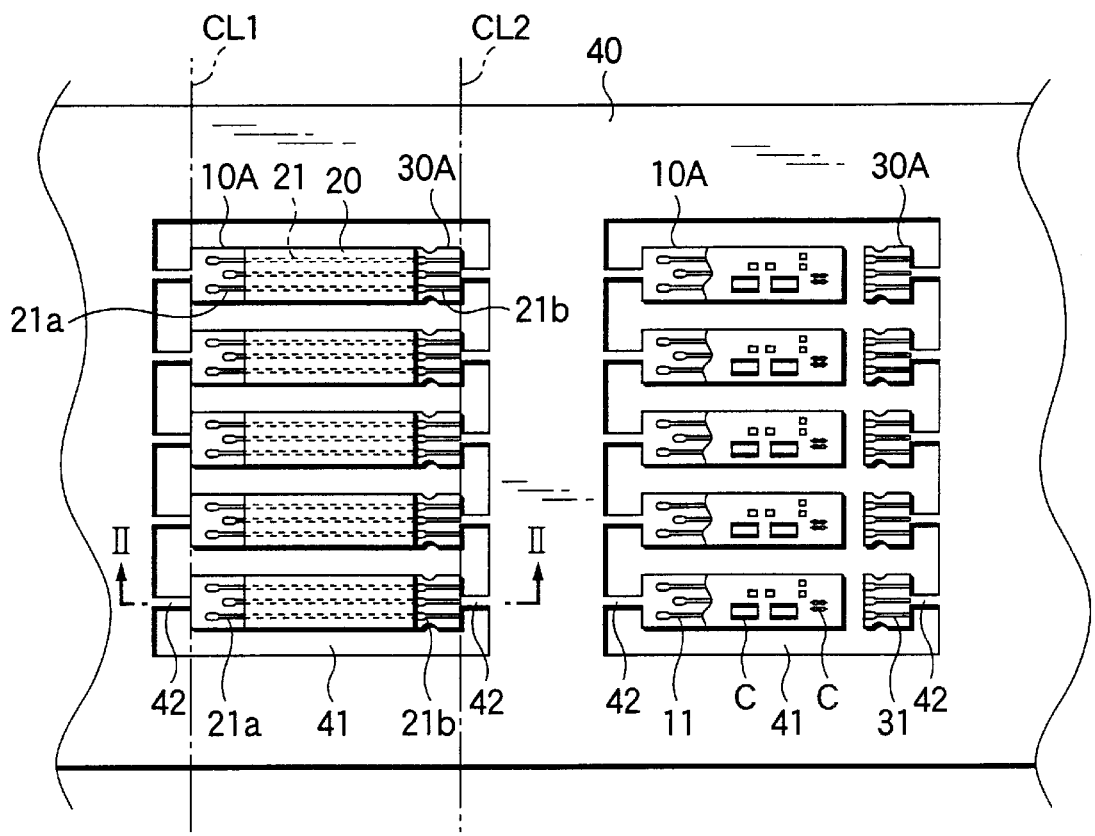
FIG. 6 is a perspective view for explaining a manufacturing step in a method of manufacturing the connector-equipped wiring board shown in FIGS. 1 to 3.
Figure 7:
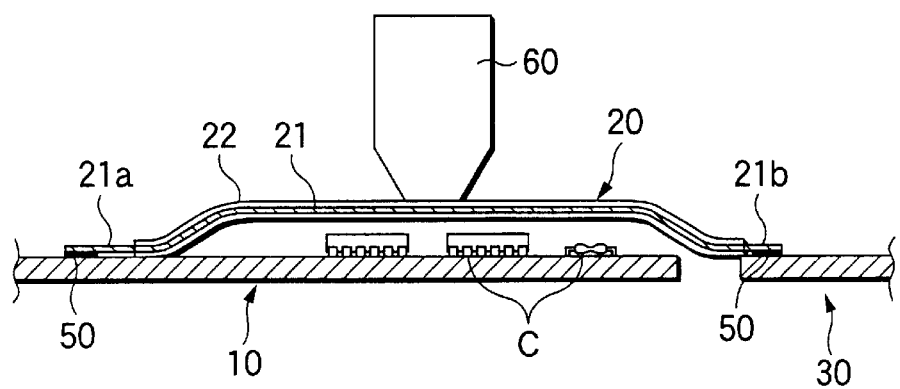
FIG. 7 is a sectional view taken along line II—II in FIG. 6.

Next, as seen from FIGS. 6 and 7, the step of connecting the flexible wiring plates 20 is performed. FIG. 6 shows the state where the flexible wiring plates 20 are connected to the respective columns of the board members 10A and 30A. In this state, the frame board 40 is still integrated to the board members 10A and 30A. Like the step of mounting the electronic components C, in the step of connecting the flexible wiring plates 20, they are connected to the predetermined positions of the board members 10A and 30A with the aid of creamy solder 50 (not shown in FIG. 6). Specifically, as seen from FIG. 7, the flexible wiring plates 20 adsorbed to a vacuum adsorption collet 60 is caused to approach the surface of the board members 10A and 30A so that the tips of 21a and 21b of the conductive patterns 21 are aligned with the respective terminals of the wiring patterns 11 and terminal patterns 31. Finally, by solder re-flow processing for the entire frame board 40 including the board members 10A and 30A, the conductive patterns 21 of the flexible wiring plate 20 are electrically connected to the wiring patterns 11 and terminal patterns 31 of the board members 10A and 30A corresponding to the wiring board 10 and the connector 30. In short, the two board members 10A and 30A are connected to each other via the flexible wiring plate 20.

As seen from FIG. 6 again, in a final step, the communicating portions 42 are cut along one-dot chain cutting lines CL1 and CL2. Thus, the respective board members 10A and 30A are separated from the frame board 40 to provide the connector-equipped wiring board A in which the wiring board 11 and the connector 30 are connected to each other via the flexible wiring plate 20.

In summary, the boards 10A and 30A corresponding to the wiring board 10 and connector 30 are handled in the same manner in substantially the same manufacturing process until they are placed in a final completed state. In addition, the flexible wiring plate 20 which connects the wiring board 10 and the connector 30 is connected to the wiring board 10 and the connector 30 in a single connecting step. The manufacturing method as described above makes it unnecessary to provide the individual manufacturing equipment for the wiring board and connector, and provides a final product through the same manufacturing process. This easily leads to improvement of the productivity and quality of the product and cost reduction through a consistent production system by factory automation.

Further, since the board members 10A and 30A corresponding to the wiring board 10 and the connector 30 are connected in their integral state, they are easily connected effectively with no misalignment in the step of connecting the flexible wiring plate. Since the thin communicating portions 42 can be removed after the flexible wiring plate has been connected, the mounting can be easily realized with great reliability. As long as the connector-equipped wiring board with the thin communicating portion 42 being left is transported and stored, it can be handled very easily.

In addition, since the flexible wiring plate 10 covers the elements on the wiring board 10, the effect of protecting the electronic components on the wiring board 10 can be enhanced.

Finally, referring to FIG. 8, an explanation will be given of a method of using the completed connector-equipped wiring board A.

Figure 8:
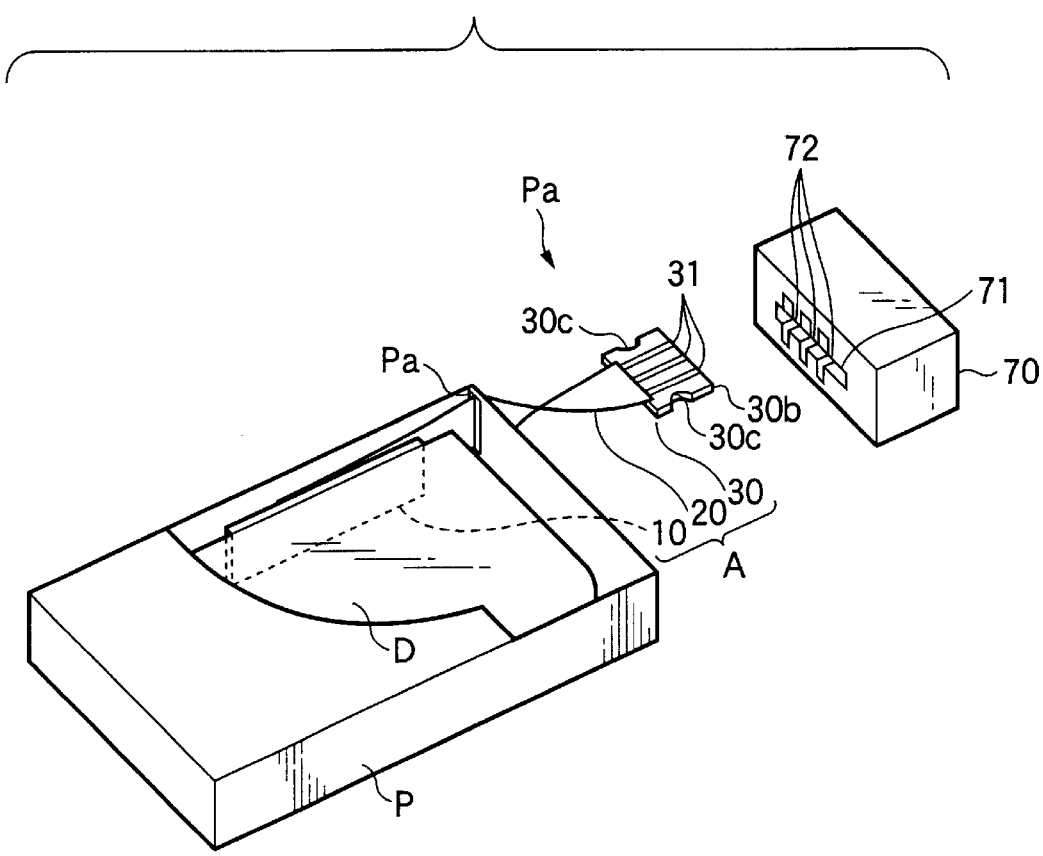
FIG. 8 is a perspective view for explaining the method of using the connector-equipped wiring board shown in FIGS. 1 to 3.
Figure 9:
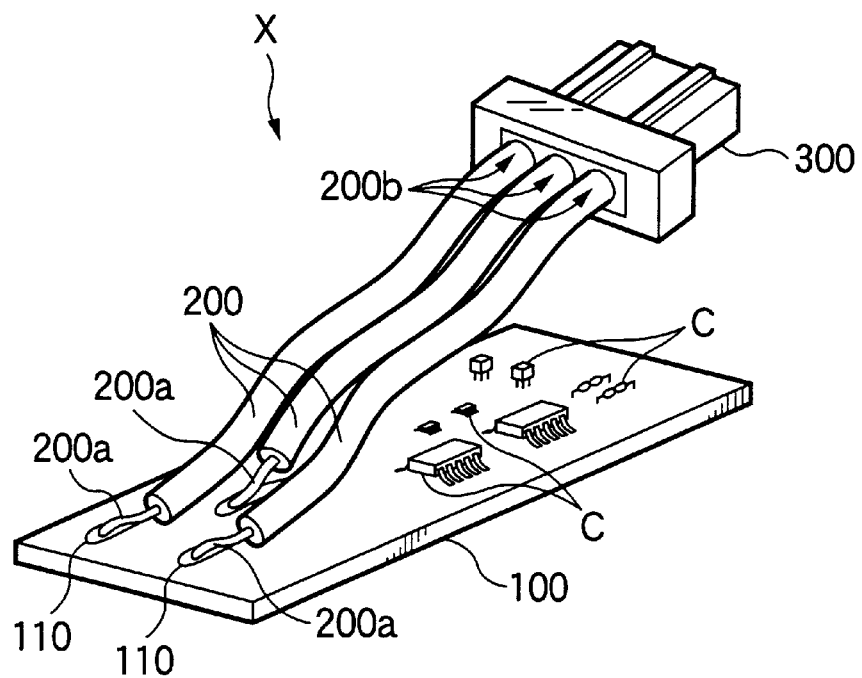
FIG. 9 is a perspective view showing an exemplary ordinary connector-equipped wiring board.

As seen from FIG. 8, the connector-equipped wiring board A can be built into a case P for a battery pack, for example, in a state where the wiring board 10 is fixed to the battery pack D. Such a case P has an opening Pa from which the flexible wiring plate can be drawn to locate the connector 30 outside the case. While the flexible wiring plate 20 is deformed, the connector 30 is fixedly inserted into a socket 70 outside the case. Incidentally, in FIG. 8, the flexible wiring plate 20 is in a twisted state, but is not required to be twisted according to the relative positioning of the connector 30 to the socket 70.

Namely, the connector 30 takes a connecting format similar to that of a "card edge type male connector". As seen from FIG. 8, such a connector 30 can be employed in the manner of insertion into and extraction from the female socket 70. The female connector 70 has a slot 71 into which a part of the tip 30b can be inserted. In the slot 71, the conductor patterns 72 corresponding to the terminal patterns 31 of the connector 30 are provided. In the state where the connector 30 has been inserted into the slot 71 of the socket 70 and coupled with the socket 70, the terminal patterns 31 of the connector 30 are brought into contact with the conductor patterns 72 within the slot 71. Thus, the connector 30 is electrically connected to the socket 70. Further, the depressions 30c of the connector 30 are fit over stoppers (not shown) which are formed so as to deform elastically. Thus, the connector 30 can be surely fixed in a state inserted into the socket 70.

Incidentally, in the embodiment described above, the wiring board and connector have formed of the same board. However, a large number of wiring boards integrally molded on the frame board and a large number of connectors integrally molded on a board may be separately prepared. In this case, they are separated into individual boards after the flexible wiring plate are mounted. In this configuration, the thickness of the connector can be selected regardless of that of the wiring board.

In the embodiment described above, the flexible wiring plate has been formed of copper foil covered with polyimide resin. However, as long as the flexible wiring plate is formed of the resin film covering the conductor patterns such as a polyimide board with printed wirings, or adhered copper foil, the material can be appropriately selected according its application. Further, both sides may not be necessarily covered with insulating coating, but only the side which may be brought into contact with a component may be covered with the insulating coating.

INDUSTRIAL APPLICABILITY

This invention should not be limited to the embodiments described above.

For example, the connector 30 may be connected to the wiring board 10 in such a fashion that the flexible wiring plate 20 is orthogonal to the longitudinal direction of the wiring board 10. The flexible wiring plate 20 may connect the wiring board 10 and the connector 30 in a shortest distance therebetween.

Further, the connector-equipped wiring board A can be build into not only the case for the battery pack but also any other means which should be coupled with the outside socket 70 through the connector.

I claim:

1. A connector-equipped wiring board, wherein a connector connected to a wiring board with an electric component mounted thereon through a conductive member can be freely routed to the wiring board, wherein said connector is made of a board, having substantially same thickness as that of said wiring board, on which an exposed terminal pattern is formed in a stripe shape on its surface, and electrically connected to said conductive member, further wherein said connector is formed in a same frame board as that of said wiring board being formed, and cut out into as a separate segment from said same frame board when said wiring board is cut out.

2. A connector-equipped wiring board according to claim 1, characterized in that said conductive member is formed of a flexible wiring plate.

3. A connector-equipped wiring board according to claim 1, characterized in that said conductive member is a flexible wiring plate made of a resin film covering a conductor pattern.

4. A connector-equipped wiring board according to claim 1 or 2, characterized in that the board of said connector has a depression for stopping away from the terminal pattern.

5. A method of manufacturing a connector-equipped wiring board, wherein a connector connected to a wiring board with an electronic component mounted thereon through a conductive member can be freely routed to the wiring board, comprising the steps of:

a board member making step of making a board member having a wiring pattern corresponding to said wiring board and another board member with a terminal pattern exposed on the surface so as to correspond to said connector, and arranging these boards as a pair;

mounting step of mounting an electronic component on the surface of the board member corresponding to said wiring board so as to communicate with the wiring pattern of the board member; and connecting step of connecting said wiring pattern and said terminal pattern to each other through said conductive member.

6. A method of manufacturing a connector-equipped wiring board according to claim 5, characterized in that said board member making step includes a step of integrally forming the board members corresponding to said wiring board and said connector from a common frame board, and the board members corresponding to said wiring board and said connector are separated from said frame board after said connecting step.

7. A method of manufacturing a connector-equipped wiring board according to claim 5 or 6, characterized in that said conductive member is a flexible wiring plate.

8. A method of manufacturing a connector-equipped wiring board according to claim 5 or 6, characterized in that said connecting step includes a step of bonding conductive portions extended out from both ends of said conductive member to said wiring pattern and said terminal pattern by soldering.

* * * * *